LOGIC CIRCUIT ARRANGEMENTS

Filed May 26, 1967

INVENTOR.
GEORGE E. SMYTHE
BY
Frank R. Trifari
AGENT

United States Patent Office 3,515,900
Patented June 2, 1970

3,515,900

LOGIC CIRCUIT ARRANGEMENTS

George Edward Smythe, Wallington, Surrey, England, assignor, by mesne assignments, to U.S. Philips Corporation, New York, N.Y., a corporation of Delaware Filed May 26, 1967, Ser. No. 641,569
Claims priority, application Great Britain, June 6, 1966, 25,017/66
Int. Cl. H03k *19/34*
U.S. Cl. 307—215 4 Claims

ABSTRACT OF THE DISCLOSURE

A circuit arrangement for processing a logical AND function will include a first and second transistor having their emitter-collector paths connected in series, the collector of the first transistor connected through a diode to one side of a voltage supply source and the emitter of the second transistor connected to the other side of the supply source. A series connected capacitor and resistor forms a storage circuit having charge and discharge cycles and is connected across the emitter-collector paths of the transistors. A relatively low impedance shunt is connected across the diode and the first transistor.

This invention relates to a logic circuit arrangement for processing a logical AND function, and particularly to a circuit arrangement operating as a coincidence switch opened for a period of time sufficient to allow passage of signals representing data which coincide with the opening of the switch.

In certain dividing or computing gating circuit operations it is necessary to detect the presence of only one signal during the open period of the gate and to derive an output with respect to that signal. Other or subsequent signals occurring in the same period can be ignored or suppressed. In order to suppress these signals further circuitry is necessary to close the gate after one signal has passed therethrough or to make the period during which the gate is open so short that only one signal can possibly occur within the open gate time. The first alternative adds expense to the circuit and the second alternative runs the risk that coincidence may be missed completely.

It is therefore an object of the present invention to provide a circuit arrangement which acts as a coincidence gate but which provides an output only once during the open gate period regardless of the number of signals received during that period or of any jitter occurring in the time of the signals.

According to the present invention a circuit arrangement for processing a logical AND function will include a first and second transistor having their emitter-collector paths connected in series, the collector of the first transistor connected through a diode to one side of a voltage supply source and the emitter of the second transistor connected to the other side of the supply source. A series connected capacitor and resistor forms a storage circuit having charged and discharge cycles and is connected across the emitter-collector paths of the transistors. A relatively low impedance shunt is connected across the diode and the first transistor. In operation relatively short input pulses are supplied to the base of the first transistor and relatively long input pulses to the base of the second transistor. The transistors thereby become conductive for the duration of their respective input pulses. During a period when a long input pulse exists a first short input pulse coinciding with part of this period causes the capacitor to discharge through the transistors but any subsequent short input pulse occurring in the same period has no effect on the capacitor; the capacitor being charged through the diode when no input pulses are received by either transistor.

Preferably, the long input pulses are at least two and a half times the interval between the short pulses.

Figure 1:
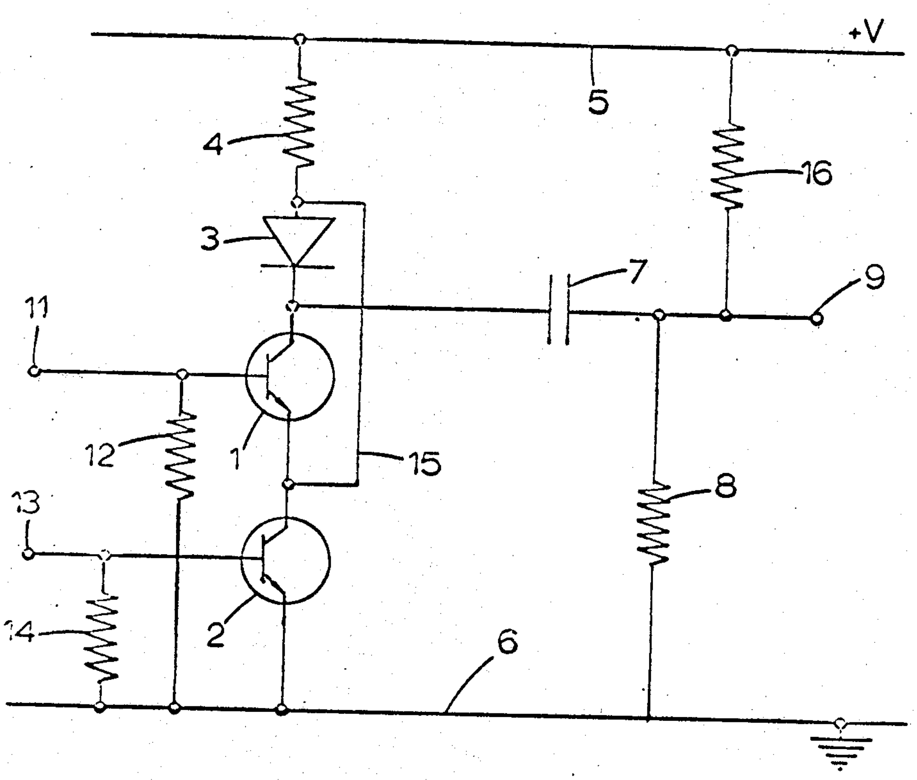
Figure 2:
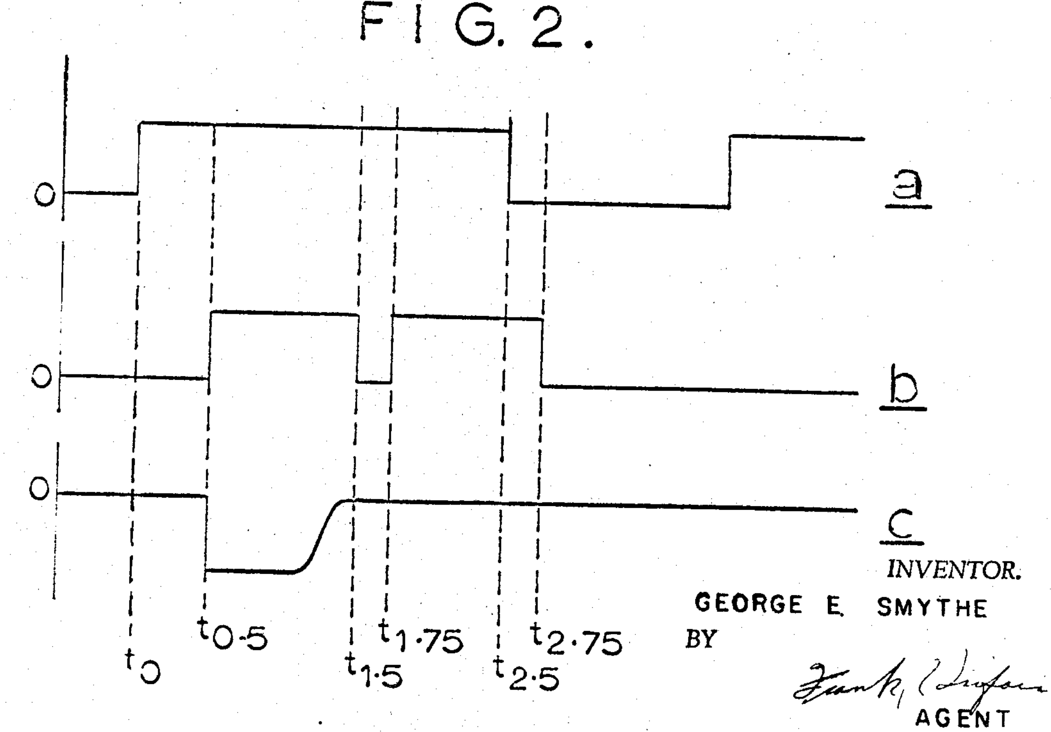

In order that the invention may be readily understood, one example of a circuit arrangement and its operation will now be described with reference to the accompanying drawings, in which FIG. 1 show the layout of a coincidence gate, and FIG. 2 shows waveforms illustrating the operation of the gate.

The coincidence gate comprises two transistors 1 and 2 which have their emitter-collector paths connected in series. The collector of transistor 1 is connected through a diode 3 and a resistor 4 to the common positive side 5 of the voltage supply. The emitter of transistor 2 is connected to the other side of the voltage supply, common ground 6. The collector of transistor 1 is also connected to one side of a capacitor 7, the other side of which is grounded via a resistor 8. An output terminal 9 is connected to the junction point of capacitor 7 and resistor 8. The base of transistor 1 is connected to a first input terminal 11 and to the common ground 6 through a resistor 12. Similarly the base of transistor 2 is connected to a second input terminal 13 through a resistor 14 to the common ground 6. A circuit shorting link 15 connects the resistor 4 to the collector of transistor 2.

The gate must produce an output pulse if input pulses applied to terminals 11 and 13 coincide in order to provide the AND logic function. The input pulses to the input terminal 13 are referred to as enabling pulses and have a duration which is, in this example, two and a half times the interval between signal pulses applied to the input terminal 11. If more than one input pulse on terminal 11 occurs during an enabling pulse on terminal 13, only that output pulse corresponding to the first input pulse on terminal 11 should result in an output pulse at terminal 9. The signal pulses are expected to occur at any time during an enabling pulse.

In operation enabling pulses, FIG. 2*a*, are fed to terminal 13. These pulses start at a time $t_0$ and terminate at a time $t_{2.5}$. Signal pulses occurring at times $t_{0.5}$ and $t_{1.75}$ and ending at times $t_{1.5}$ and $t_{2.75}$ respectively, FIG. 2*b* are fed to terminal 11. Before the time $t_0$ no pulses were present and consequently both transistors 1 and 2 were cut off. The capacitor 7 thus has charged via the path of resistor 4, diode 3 and resistor 8, and will charge whenever transistor 2 is nonconducting. At the time $t_0$ the enabling pulse begins and transistor 2 is rendered conducting, its collector potential dropping to nearly ground potential. However, since the diode 3 is reverse biased the collector of transistor 1 does not drop. The junction of the diode 3 and resistor 4 is nearly at ground potential due to the short circuit link 15. At time $t_{0.5}$, when a signal arrives at terminal 11, the transistor 1 is rendered conductive and its collector potential drops nearly to ground. Capacitor 7 thus discharges through the transistors 1 and 2 which are now both conducting and an output pulse, FIG. 2*c*, appears at the terminal 9 at the time $t_{0.5}$. At the end of the signal pulse, time $t_{1.5}$, the capacitor 9 is substantially fully discharged, the capacitance value being chosen so that this occurs, and thus the output pulse terminates. Transistor 2 is still conducting and since the impedance of the path between common lines 5 and 6 via resistor 4, link 15 and transistor 2 is much lower than the impedance of the path via resistor 4, diode 3, capacitor 7 and resistor 8, the capacitor 7 will not be recharged. Recharging is further prevented in that the resistor 8 and a resistor 16 form a potential divider holding terminal 9 at a voltage slightly greater than the collector potential of transistor 2 thereby holding diode 3 reverse biased. Thus when the second signal pulse occurs at terminal 11 at the time $t_{1.75}$ and transistor 1 becomes conducting the capacitor 7 is still in its uncharged state and thus no further output pulse occurs. When finally transistor 1 cuts off again at $t_{2.25}$ and transistor 2 later cuts off at $t_{2.5}$ the capacitor 7 is able to charge again ready for the next enabling pulse.

This circuit arrangement provides a convenient and inexpensive form of coincident gate, allowing only one output pulse to occur during the period of one enabling pulse regardless of the number of signal pulses occurring during the same period. It is thus useful for use in apparatus where discrimination is necessary to overcome jitter problems.

The above cited embodiments are intended as exemplary only, and while I have described my invention with a specific application and embodiment thereof, other modifications will be apparent to those skilled in the art without departing from the spirit and scope of the invention as defined by the appended claims.

I claim:

1. A logic circuit arrangement for deriving an output pulse from a time coincidence between first and second input pulses, comprising, first and second transistors each having an emitter, base and collector, means series connecting the emitter-collector paths of each of said transistors, diode means coupling the collector of the first transistor to one side of a source of voltage supply, means connecting the emitter of the second transistor to the other side of said supply, a storage circuit having charge and discharge cycles, means connecting said storage circuit across the emitter-collector paths of said transistors, means applying said first pulse to the base of said second transistor for charging said storage circuit, means applying said second pulse to the base of said first transistor for discharging said storage circuit, means for deriving said output pulse from the discharge of said storage circuit, and means connected to said transistors for preventing said storage circuit from recharging for the duration of said first pulse.

2. The combination of claim 1 wherein said storage circuit comprises a capacitor and a resistor connected in series, one end of said capacitor being connected to the collector of said first transistor, the other end of said resistor being connected to the emitter of said second transistor, said output pulse being derived from the junction of said capacitor and said resistor.

3. The combination of claim 1 wherein the long input pulses are at least two and a half times the length of the short input pulses.

4. The combination of claim 1 wherein the means connected to said transistors for preventing said storage circuit from recharging for the duration of said first pulse includes a relatively low impedance shunt connected across the diode and the first transistor.

References Cited

UNITED STATES PATENTS

| | | | |
|---|---|---|---|
| 2,945,135 | 7/1960 | Wilhelmsen | 307—254 |
| 3,309,529 | 3/1967 | Bates et al. | 307—218 X |

DONALD D. FORRER, Primary Examiner

B. P. DAVIS, Assistant Examiner

U.S. Cl. X.R.

307—218, 238, 246